US009235825B2

(12) United States Patent
Shao

(10) Patent No.: US 9,235,825 B2
(45) Date of Patent: Jan. 12, 2016

(54) PROCESSING LOAD PROFILES FOR CONSUMPTION MANAGEMENT SYSTEMS

(75) Inventor: Victor Shao, Mountain View, CA (US)

(73) Assignee: Green Charge Neworks LLC, Santa Clara, CA (US)

( * ) Notice: Subject to any disclaimer, the term of this patent is extended or adjusted under 35 U.S.C. 154(b) by 564 days.

(21) Appl. No.: 13/412,530

(22) Filed: Mar. 5, 2012

(65) Prior Publication Data

US 2013/0231790 A1     Sep. 5, 2013

(51) Int. Cl.
| | |
|---|---|
| *G05D 3/12* | (2006.01) |
| *G05D 5/00* | (2006.01) |
| *G05D 9/00* | (2006.01) |
| *G05D 11/00* | (2006.01) |
| *G05D 23/00* | (2006.01) |
| *G05D 17/00* | (2006.01) |
| *G06F 17/50* | (2006.01) |
| *G06G 7/54* | (2006.01) |
| *G06Q 40/00* | (2012.01) |
| *G07F 19/00* | (2006.01) |
| *G06F 17/30* | (2006.01) |
| *G06F 3/048* | (2013.01) |
| *G06Q 10/10* | (2012.01) |
| *G06Q 50/06* | (2012.01) |
| *H02J 3/14* | (2006.01) |
| *H02J 3/00* | (2006.01) |
| *G01D 4/00* | (2006.01) |
| *G01R 19/25* | (2006.01) |

(52) U.S. Cl.
CPC .............. *G06Q 10/10* (2013.01); *G06Q 50/06* (2013.01); *H02J 3/14* (2013.01); *G01D 4/00* (2013.01); *G01R 19/2513* (2013.01); *H02J 2003/007* (2013.01); *Y02B 70/3225* (2013.01); *Y02B 90/245* (2013.01); *Y02E 60/76* (2013.01); *Y04S 10/54* (2013.01); *Y04S 10/60* (2013.01); *Y04S 20/222* (2013.01); *Y04S 20/38* (2013.01); *Y04S 20/40* (2013.01); *Y04S 40/22* (2013.01)

(58) Field of Classification Search
CPC ........... G06F 1/26; G06F 19/00; G06F 17/50; G06F 13/50; G06F 1/28; G06F 3/048; G06Q 50/00; G05D 23/19
USPC ................. 700/286, 291, 295, 296, 297, 300; 703/18, 1; 705/34, 40; 707/17, 741; 715/772
See application file for complete search history.

(56) References Cited

U.S. PATENT DOCUMENTS

| | | |
|---|---|---|
| 5,500,561 A | 3/1996 | Wilhelm |
| 5,930,773 A | 7/1999 | Crooks |
| 6,618,709 B1 | 9/2003 | Sneeringer |
| 6,728,646 B2 | 4/2004 | Howell |

(Continued)

*Primary Examiner* — Mohammad Ali
*Assistant Examiner* — Md Azad
(74) *Attorney, Agent, or Firm* — Richard C. Galati; Holland & Hart LLP

(57) ABSTRACT

Methods and systems using aggregated electrical system load profiles in determining additional load profiles, and determining consumption management system characteristics, features, and operating requirements at a site are disclosed, along with methods of generating and maintaining databases of load profile information and consumption management system requirements. By using some embodiments of the methods and systems described herein, it is faster and easier to design and implement effective consumption management systems, to determine problematic electrical systems at a site, and to diminish anomalous consumption patterns in an aggregate unprofiled electrical system load profile.

20 Claims, 10 Drawing Sheets

(56) References Cited

U.S. PATENT DOCUMENTS

| | | |
|---|---|---|
| 7,069,161 B2 | 6/2006 | Gristina |
| 7,894,946 B2 | 2/2011 | Kulyk |
| 7,949,615 B2 | 5/2011 | Ehlers |
| 2003/0055677 A1 | 3/2003 | Brown |
| 2004/0024483 A1 | 2/2004 | Holcombe |
| 2010/0145534 A1* | 6/2010 | Forbes et al. ............... 700/291 |
| 2010/0283606 A1 | 11/2010 | Tsypin |
| 2010/0286937 A1 | 11/2010 | Hedley |
| 2011/0004358 A1 | 1/2011 | Pollack |
| 2011/0046806 A1 | 2/2011 | Nagel |
| 2011/0046904 A1 | 2/2011 | Souilmi |
| 2011/0173109 A1* | 7/2011 | Synesiou et al. ............... 705/34 |
| 2011/0184574 A1 | 7/2011 | Le Roux et al. |
| 2011/0208369 A1* | 8/2011 | Yang et al. ............... 700/296 |
| 2012/0010757 A1* | 1/2012 | Francino et al. ............... 700/291 |
| 2012/0035777 A1 | 2/2012 | Park |
| 2012/0074780 A1* | 3/2012 | Fleck ............... 307/35 |
| 2012/0185105 A1* | 7/2012 | McMullin ............... 700/291 |
| 2013/0117004 A1* | 5/2013 | Schultz et al. ............... 703/18 |

* cited by examiner

FIG. 5
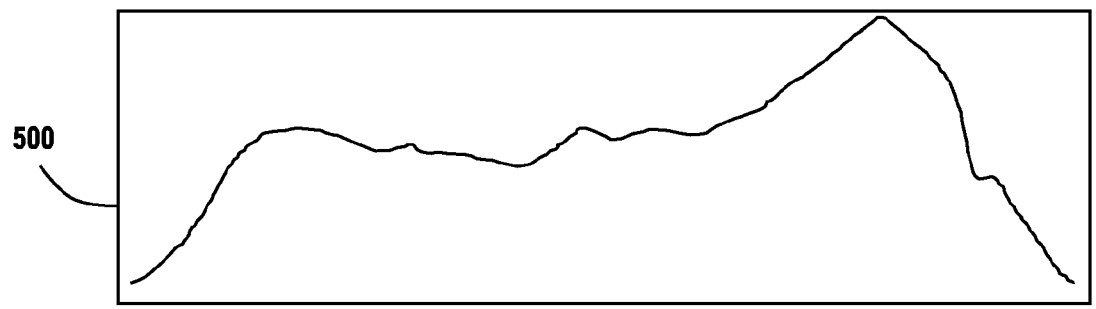
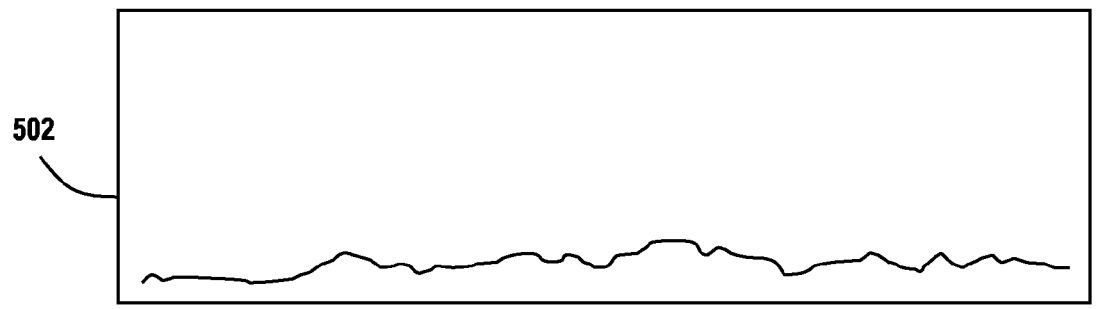
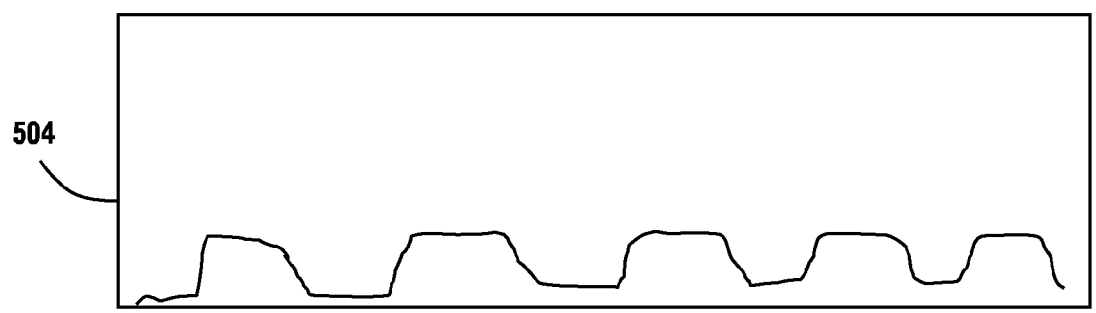
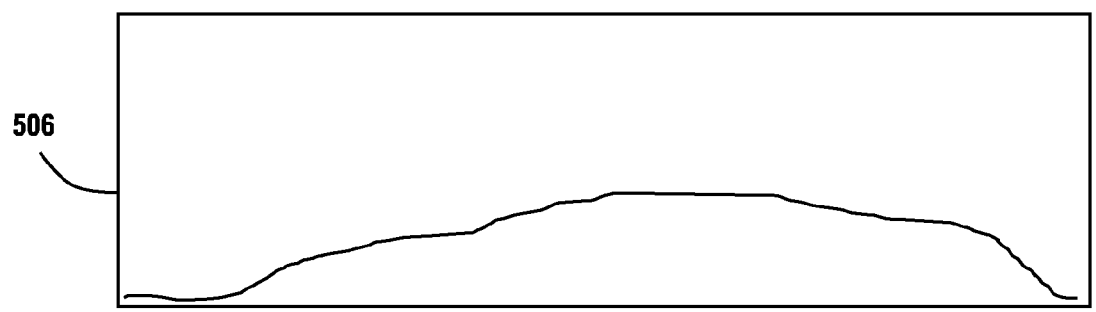

FIG. 6
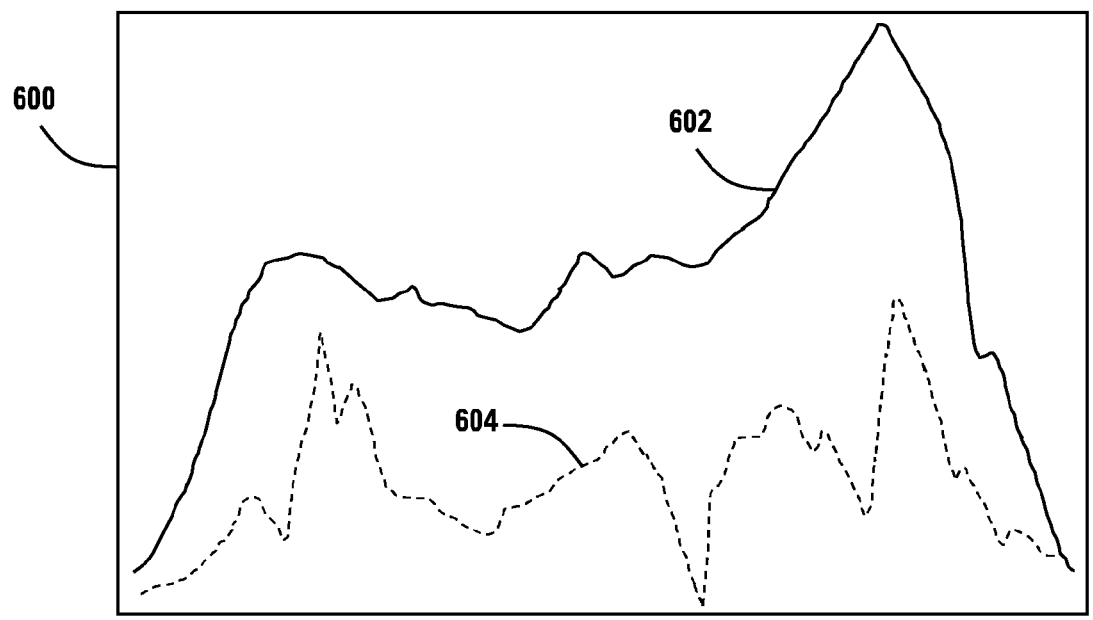
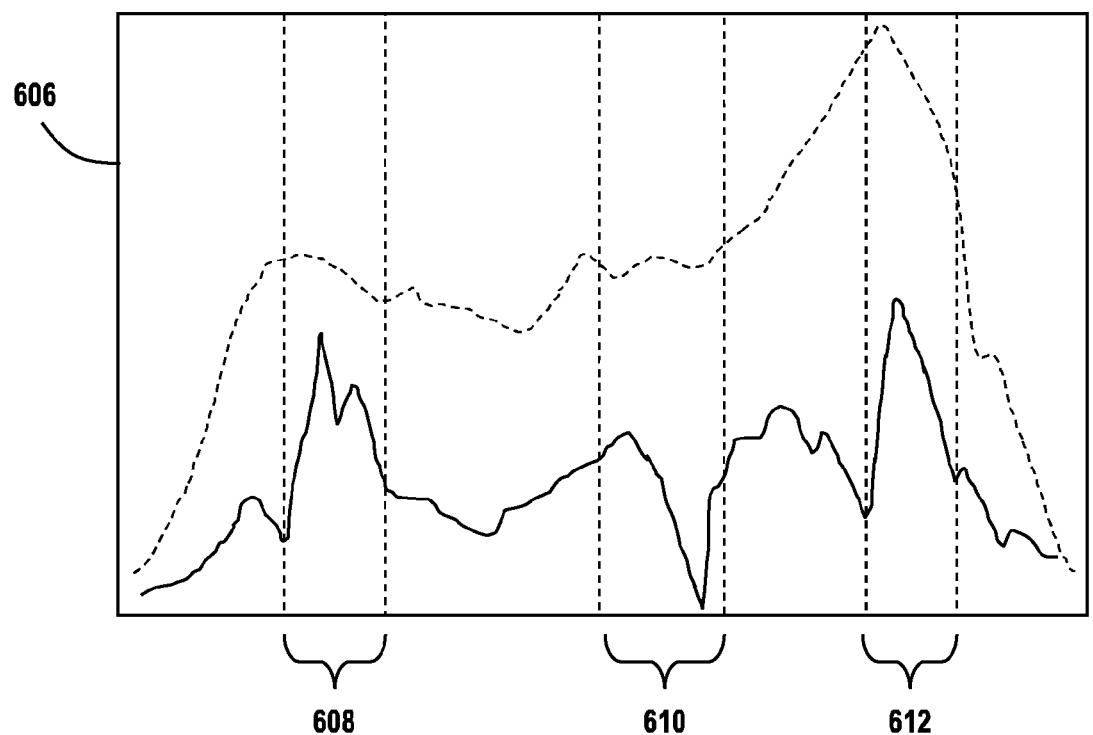

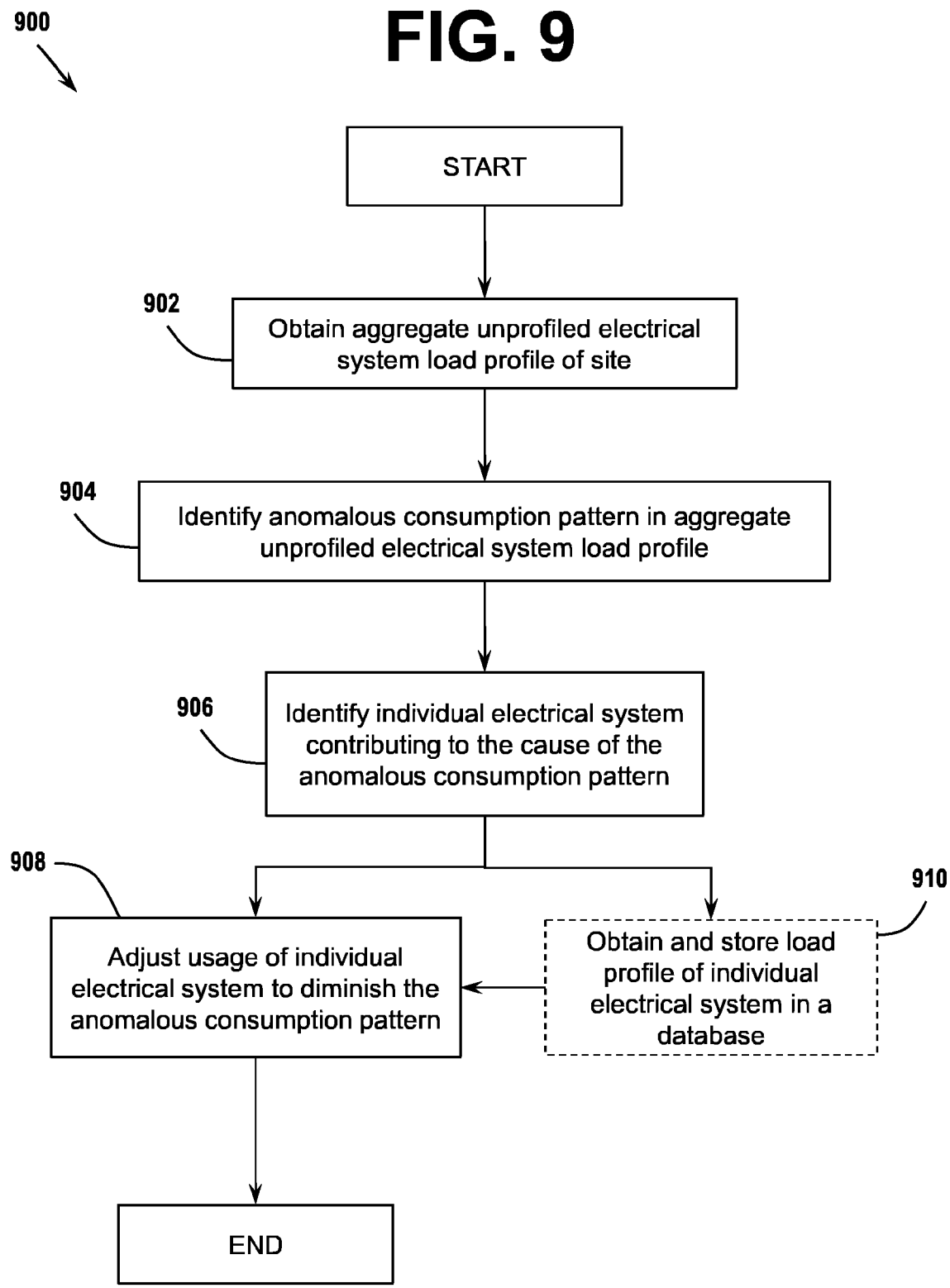

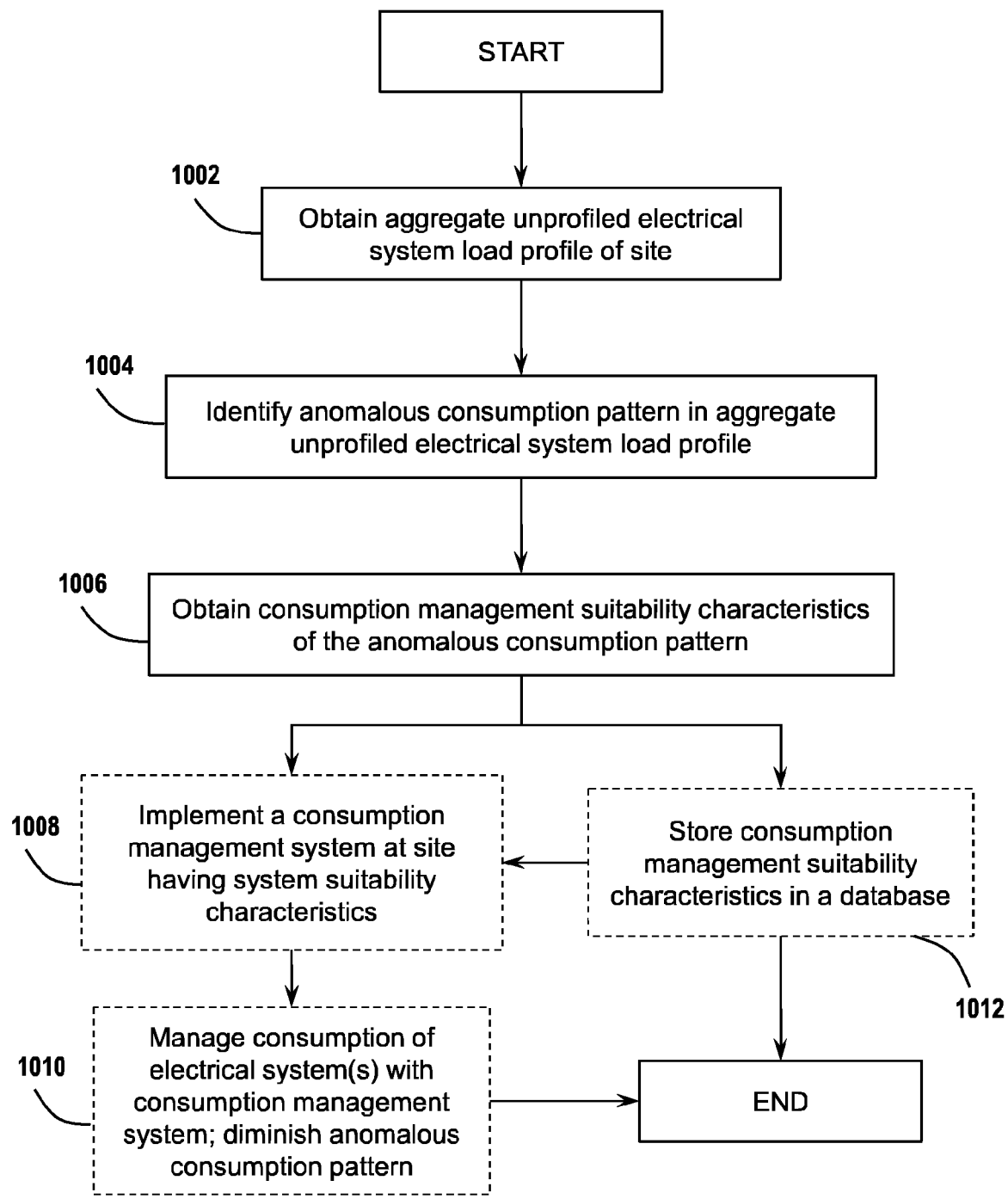

PROCESSING LOAD PROFILES FOR CONSUMPTION MANAGEMENT SYSTEMS

CROSS-REFERENCE TO RELATED APPLICATIONS

A related patent application was filed in the United States Patent and Trademark Office on Mar. 5, 2012 as Ser. No. 13/412,517, titled "Aggregation of Load Profiles for Consumption Management Systems," which is hereby incorporated by reference in its entirety as if it has been reproduced as part of this document.

BACKGROUND

The present invention is directed to the fields of energy consumption management analysis and diagnostics, consumption management systems, electrical distribution grid demand management, and related fields.

Electricity consumers in recent years have been faced with rising energy costs and rising needs to address environmental and efficiency concerns. Energy consumption management systems have been developed with these needs in mind to reduce energy consumption during periods having higher electricity costs, to expand the availability of charging electrically-powered vehicles, to participate in demand response programs hosted by utilities, and to counteract the appearance of demand charges assessed by utilities, among other goals. These systems typically monitor the consumption of a site, generate a load profile for the site to visualize the consumption over time, and control the use of loads, energy storage, on-site generation, and other assets in order to manipulate the shape and size of the load profile of the site, thereby optimizing the consumption of electrical energy used to better meet the needs of consumers.

There are many obstacles to implementing a consumption management system. One such obstacle is an unknown load profile for a site. Because consumption management systems become significantly more cost effective and efficient when tightly integrated with the consumption needs of the site, load profiles are required in many cases in order to select a consumption management system that can best serve the needs of the customer. Unfortunately the most effective load profiles can take weeks, months, or even longer to generate by measuring consumption data at a site in real-time. Even after a load profile is generated, it may not give a clear picture as to how to best manage the consumption at the site. It may not be immediately apparent which devices or electrical systems at the site need to be controlled or mitigated in order to achieve the consumer's consumption management goals because all of the systems at the site are simultaneously measured and details about individual system management needs and suitability for curtailment, mitigation, and other practices are buried in the overall information gathered.

While many technologies have been developed for optimizing the usage of consumption management devices, they are difficult to match to unknown sites or for sites in which individual electrical systems have different needs. Therefore it is common that the provision and installation of management services and devices will have an unpredictable impact on the consumption of the site. This leads to inefficient expense of capital and other difficult up-front decisions about how to best approach energy consumption management for a particular site.

BRIEF SUMMARY

There is a need for methods providing more expedient electrical system load profiling and that can assist in managing a utility customer's electrical systems, particularly when used to optimize the components and capabilities of consumption management systems that will be implemented for consumers. Embodiments of the invention presented herein assist in providing faster and easier energy consumption auditing, automatic identification of components that would effectively manage loads and of anomalous loads, and contribute to an ongoing self-learning process that improves consumption auditing and implementation of consumption management systems as more information is gathered.

In some embodiments of the invention, load profiles are stored and maintained in a database or repository of indexed load profile information. Indexed load profiles may be assembled into aggregate load profiles suitable for selecting or designing a consumption management system. Load profiles are obtained by monitoring devices and gathering consumption information from the devices over time. In some embodiments, load profiles for a device may be used as models of load profiles of devices that have not been measured. In some embodiments the indexed of load profiles indicate management system requirements such as consumption mitigation, curtailment, or load shedding requirements or availability for the profiled devices. In some embodiments, the database of load profiles is used to select or design a consumption management apparatus for use at the site at which a load was profiled, or at a site for which a similar load has been profiled, even if the similar load was not profiled at the site.

In some embodiments of the invention, an anomalous consumption pattern is detected in a load profile that is an aggregation of loads at the site that are unprofiled. One or more of the individual unprofiled electrical systems are compared to the aggregate load profile and are identified as contributing to the cause of the anomalous consumption pattern. These loads are then profiled and may be added to a database of profiled loads for future energy audits. In some embodiments, a consumption management system for the site may be implemented based on the connections and components needed to manage these individual electrical systems. This management system may be used to manage the overall load profile to prevent it from exceeding a given utility consumption level, such as a demand charge-invoking threshold value. The new load profiles of the identified electrical systems may also be used as the basis for an estimated aggregate load profile generated from profile data of all of the profiled loads at the site, which may be used as a guide for determining appropriate consumption management components and strategies.

In some embodiments, identified individual electrical systems that contribute to the anomalous consumption pattern are classified and the characteristics of a suitable consumption management system for those systems are obtained. These characteristics can be assembled into a database of information to be used as a reference when implementing new consumption management systems in the future.

In some embodiments, the anomalous consumption pattern in the aggregate unprofiled electrical system load profile is used as a direct indicator of how to make and/or use a consumption management system at the site.

Additional and alternative features, advantages, and embodiments of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In addition to the novel features and advantages mentioned above, other objects and advantages of the present invention will be readily apparent from the following descriptions of the drawings and exemplary embodiments.

FIG. 5 shows charted load profiles of electrical systems and an overall load profile of a site.

FIG. 6 shows examples of anomalous load patterns in an aggregate unprofiled electrical system load profile.

FIG. 9 is a block diagram flowchart illustrating a method of an embodiment of the invention.

FIG. 10 is a block diagram flowchart illustrating a method of an embodiment of the invention.

DETAILED DESCRIPTION

General Information

Figure 1:
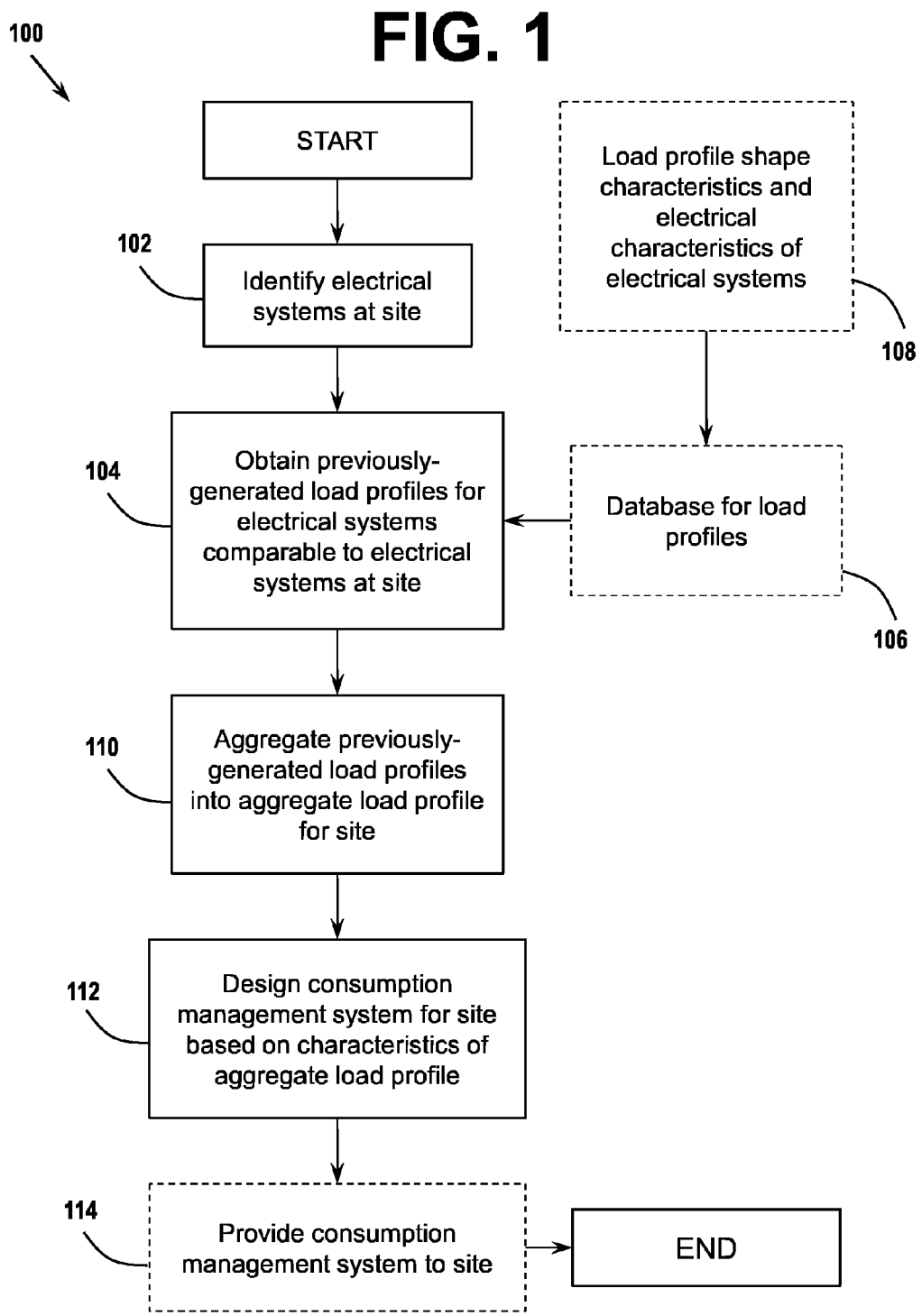
FIG. 1 is a block diagram flowchart illustrating a method of an embodiment of the invention.

Typical embodiments of the invention are directed to methods and systems using electrical load profiles in databases and for implementing customized electricity consumption management systems. Preferred embodiments of the invention may provide ability to more effectively determine the needs of an energy consumption management system at a site, may assist in identifying loads that need to be adjusted or controlled, and may constantly improve the process as more information is gathered about various electrical systems at sites.

As used herein, an "electrical system" refers to an electrical circuit or device which consumes electrical energy. Typical exemplary sites such as a place of business have one or more electrical systems connected to an electrical service panel, and the electrical systems draw electrical energy from a connection to an electrical utility distribution grid. Individual electrical systems may be separable from each other, or co-dependent on each other to operate, depending on the configuration of each individual electrical system. Individual electrical systems may include one or more devices or loads, insofar as they all may be categorized as a single system of loads. In this document, an electrical system may be referred to as a load for convenience, but when this reference is used it should not be construed as excluding an electrical system that contain plural or multiple loads.

An electrical system may be "profiled," or, in other words, have a load profile generated for it, when characteristics of its electrical consumption are tracked over time. Characteristics of electrical consumption in this case are measurable or derived electrical characteristics, such as the current or voltage of the electrical system, current or voltage of connections to the electrical system, the wattage or watt-hours used by the electrical system, and other comparable electrical characteristics. A load profile displays the power used by the electrical system over time, and the energy used by an electrical system may be determined by integration of the load profile over time. Load profiles can span any length of time and can be a point of analysis for consumption management manipulation in many ways.

"Consumption management system" (or "CMS") as used herein, refers to a system of electrical devices and processes capable of affecting the consumption of an electrical system, group of electrical systems, or of a site as a whole. For example, a CMS may comprise a controller such as a computer that, when connected to an electrical system, controls when the electrical system is turned on or off, thereby turning the consumption of the electrical system on or off. A CMS may also be used to execute instructions for turning electrical systems on and off or to turn consumption of an electrical system up or down (also referred to as curtailment or load shedding), and other consumption control schemes known in the art. Other CMSs may affect consumption by mitigation through providing energy to the site or to electrical systems from an energy source, such as an energy storage system (ESS) (such as a battery, capacitor, flywheel or other similar device) or generation asset (such as a fuel-based generator, photovoltaic generator, fuel cell, or other similar device). Providing energy to a load or electrical system may also be referred to as mitigation or load shifting.

CMSs are beneficial to users in that they can provide many different kinds of consumption management, such as load leveling, wherein the consumption of a site or electrical system is made more level over time (as opposed to rising during peak consumption periods and dropping during low-consumption periods) and thereby reducing electricity bills to the customer by deferring consumption to times of lower electricity costs, or peak mitigation, wherein spikes or plateaus in consumption are mitigated or otherwise reduced in order to avoid incurring electrical utility-assessed demand charges or overloading electrical system capabilities.

A CMS may be designed in many ways due to the multitude of different kinds of loads to which it can connect and the many different ways in which it can manage consumption of the same loads. Components of a CMS may also vary widely in their cost to implement at a site, so it is important to optimize the number and kind of components within a CMS to maximize a return on investment. Embodiments of the invention may assist in facilitating the analysis of a site or electrical systems so that a CMS may be designed and brought to action at a site, or be determined to not be implemented at the site, more efficiently.

Aggregation of Load Profiles

FIG. 1 shows a block diagram of an exemplary embodiment of the invention wherein a method of designing a CMS for a site is provided. The method 100 starts by identifying electrical systems at a site at step 102. Identifying an electrical system at a site here entails detecting that an electrical system is supplied with energy at the site from the utility distribution grid, such as that a refrigerator or electric vehicle charger is able to draw electrical energy from the utility distribution grid connection through wiring to a main electrical panel at the site. This may be done by inventory, searching the location, gathering identities of electrical systems at the site from a list or database showing or containing the devices installed at the site, or collecting information about the identities of the electrical systems that are able to draw electricity from the grid at the site in some other way. For example, if the site has "smart" loads, they may be able to communicate their identity in some way, and that information may be gathered in this step (i.e., 102). Not all electrical systems at a site need to be identified in this step, but in most cases, it is best to collect identity information about as many loads or electrical systems as possible.

Next, in step 104, previously-generated load profiles are obtained for electrical systems that are comparable to the electrical systems at the site. When load profiles are obtained in this manner, this action may refer to fetching a load profile from a list, database, or other repository of load profiles, or may refer to measuring the consumption of the electrical system or a comparable electrical system over time, thereby generating a load profile before completing this step (i.e. 104).

A comparable electrical system may refer to an electrical system that is built or configured the same as, nearly the same as, or similarly to, the electrical system to which it is comparable. The scope of what is comparable may vary based on the settings of the electrical system, the electrical characteristics of the electrical system, the place in which the electrical system is used, the history of prior use of the electrical system, and other factors and characteristics that may have an effect on the shape or other features of the load profile obtained. In a given site, electrical systems which are comparable to the electrical systems at the site are those systems for which the load profiles obtained provide an approximation or estimation or projection of the load profiles that the electrical systems at the site would produce if they were to be profiled at that time. For example, a previously-generated load profile of a lighting system at a convenience store that is sized approximately the same, contains approximately the same style of lights, and has been in use for approximately the same length of time may be comparable under this definition, and the load profile of the comparable lighting system may be obtained in this step 104. In another example, a previously-generated load profile of a refrigeration system that is located outdoors in a hot climate would not be used as a comparable electrical system load profile for a refrigeration system that is indoors in a cool climate unless the load profile of the indoor refrigeration system is expected to be very similar to the outdoor refrigeration system (such as if each refrigeration system has exceptional insulation capabilities and is very rarely opened). In some preferable cases, the comparable electrical system is identical to the electrical system at the site. In other words, the comparable electrical system's load profile is a load profile that was measured from the same electrical system previously under identical operating conditions and there are negligible changes in the electrical system over time. In some embodiments, a comparable electrical system is deemed to be comparable because of electrical characteristics of the electrical systems that are similar or shared between them, such as similarity of voltage requirements, size, need for AC or DC power, current draw, backup power usage, etc.

In some embodiments, previously-generated load profiles may be obtained from a database 106 containing load profiles. A database may refer to an information storage system or repository such as a list, spreadsheet, or other storage point, whether it is stored in paper, on a computer or memory therein, or by some other storage means known in the art. In some of these embodiments, load profile data is also stored with the load profiles, such as load profile shape characteristics and electrical characteristics of the electrical systems from which the load profiles were originally generated, as indicated by box 108. A database in these embodiments may be an indexed database, wherein the entries in the database are indexed or searchable by their content or by tags assigned to the entries. For example, an indexed database of load profiles may be searchable for load profiles having a peak in consumption during a given time of day or day of the month or may be searchable for load profiles that were generated from loads that consume 20 kilowatts or more at once or that have power-over-Ethernet capability. An indexed database embodiment having tags could be searchable by other information attached to the entries in the database, such by entries with load profile conditions such as a "used by a department store" tag, a geographic location tag, a "snowy weather" tag, date of generation tag, or other tags associated with the entries that could encompass a multitude of different possibilities. These tags and other information attached to or held within a database entry may facilitate obtaining previously-generated load profiles from the database more readily or by categorizing the entries for better organization. They may help identify which electrical systems and load patterns would be comparable to the electrical systems at the site.

Load profile data may include load profile characteristics or load profile shape characteristics. Load profile characteristics include measures such as the magnitude of portions of the load profile such as maximum/minimum/average consumption levels and others; the length of the load profile; the time period in which it was gathered; shape characteristics such as peaks, spikes, plateaus, undulations, jitter, and the like, and other recorded features and information stored in or determinable from the profile.

Electrical characteristics of electrical systems may include measurable electrical quantities, such as current, voltage, resistance, etc., or other electrical features associated with the electrical systems, such as types or numbers of connections or interfaces, capacity of components in the electrical systems, power requirements, operating condition requirements, the age of the systems, usage history, and other features that would give a more complete understanding of the device or system from which a load profile is collected or generated.

Once the previously-generated load profiles for comparable electrical systems are obtained, they are aggregated into an aggregate load profile for the site in step 110. The action of aggregating the load profiles refers to adding time-correlating data in the load profiles together to provide a load profile that is the aggregate sum of the load profiles aggregated. For instance, if two load profiles are obtained, then the magnitude of each profile is added together based on the time that the profile was gathered. If one profile was gathered from 9:00 a.m. to 10:00 a.m., and the second was gathered from 8:00 a.m. to 10:00 a.m., then the sum of the magnitudes of the profiles during the overlapping time period from 9:00 to 10:00 a.m. would be the aggregate load profile. In some cases, load profiles may be generated on different days over overlapping times of those days, so the days in which the profiles were generated do not overlap, but the times of day do overlap. In these cases, and the aggregation method of the load profiles takes into account the differences that the days of generation may have on the load profile and may, for example, allow aggregation of two load profiles for days that are near to each other chronologically, meteorologically, or by some other standard, but not for days that are far apart by those measurements.

Figure 2:
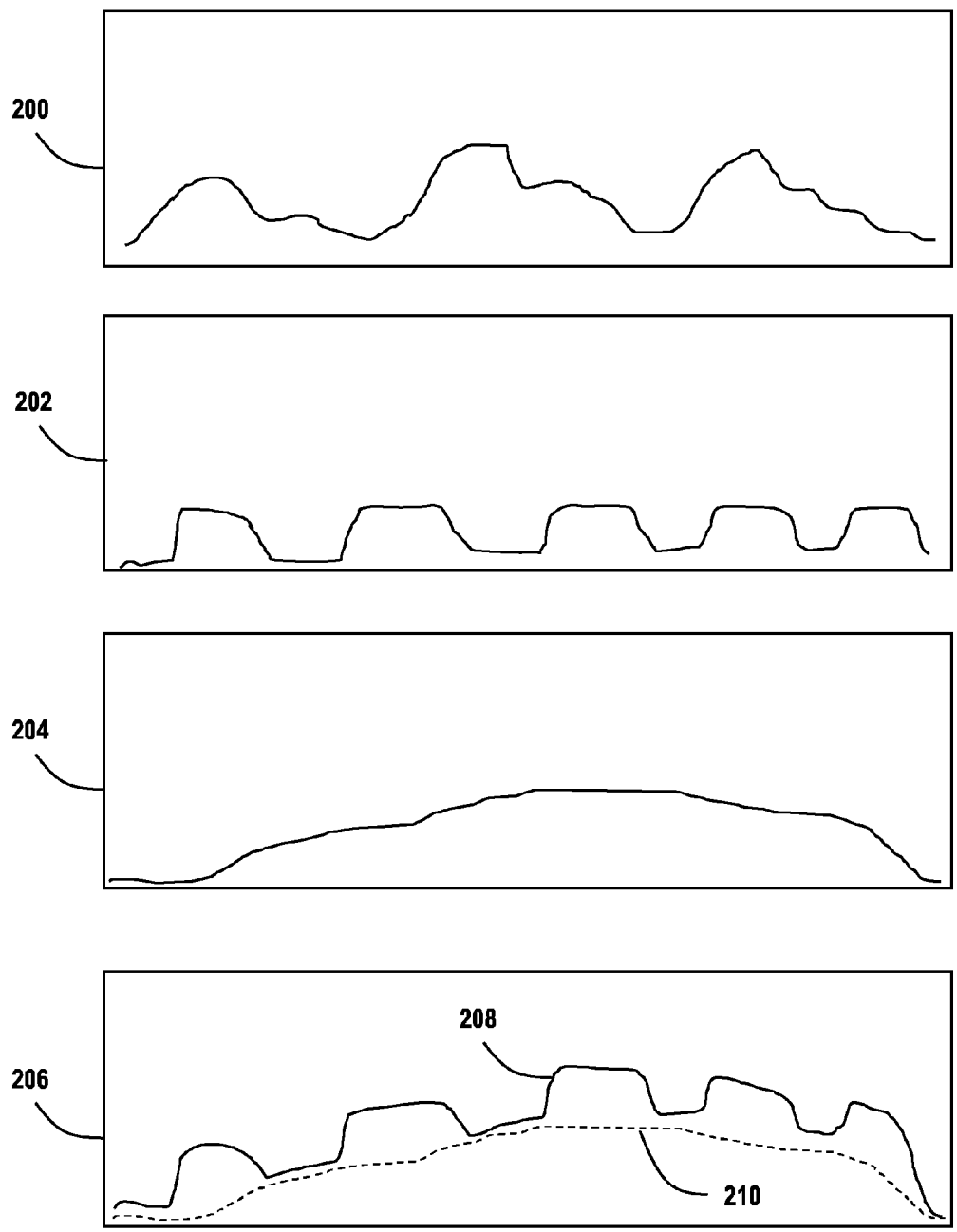
FIG. 2 shows charted load profiles of electrical systems at a site and an aggregated load profile from an embodiment of the invention.

An example of a load profile aggregation process is illustrated in connection with FIG. 2, which shows load profiles of different electrical systems in charts 200, 202, and 204. Charts 202 and 204 are aggregated to produce chart 206, wherein the aggregate load profile 208 is shown as the sum of the other two charts. (Profile 210 shows the consumption of the load profile in chart 204, for reference and comparison.)

These charts are not to scale, but are intended as an illustration of the results of aggregation without respect to specific values shown by the load profiles.

The aggregation of load profiles in step 110 may be completed using varying methods depending on the embodiment of the invention in use. In some embodiments, it is preferable to aggregate all of the load profiles obtained in step 104 into an overall aggregate load profile. This may be advantageous in that it may give the best projection of how a load profile for the site would appear if it was generated from the overall site itself. In some embodiments, it is preferable to aggregate load profiles that come from electrical systems having similar or particular characteristics, such as aggregating profiles that come from electrical systems that are curtailable, non-curtailable, high-power, low-power, AC, DC, are used for a similar purpose, have similar load profile shapes, other selected criteria, or combinations of these. This may be advantageous in step 112, where features of a consumption management system may be selected, as it gives a guide as to which devices or components of the CMS may be needed, as discussed in further detail below. For example, if only non-curtailable load profiles are aggregated in step 110, the CMS may only need to be designed to be able to mitigate the highest peaks in the aggregated load profile of non-curtailable loads with an energy storage system, since peaks due to other loads may be curtailed in some manner. Thus, limits of the size and type of energy storage system may be derived from this aggregate load profile of non-curtailable loads. For example, if charts 200, 202, and 204 are profiles of electrical systems at a given site, and only charts 202 and 204 are non-curtailable, then those two charts' load profiles may be aggregated to get aggregated load profile 208 that represents only non-curtailable loads.

Once load profiles have been aggregated in step 110, a CMS is designed for the site in step 112 that is based on characteristics of the aggregate load profile. Designing a CMS for a site entails determining the needs of the CMS to connect to and manage the consumption of the site or electrical systems therein. A CMS may be designed to manage the entire site's consumption or just the consumption of certain electrical systems which are a subset of the site's consumption. A CMS may be designed with different types or numbers of particular ports or connection protocols; types or numbers of controllers, computers, or other processing means; types, sizes, numbers, and other features of energy sources such as energy storage systems or generation systems; and other features that may make one CMS better at managing the consumption of one site or load profile than another. For example, step 112 may include measuring the size and shape of a peak in consumption in the aggregate load profile, then determining the kilowatt-hours of energy storage needed to be able to mitigate that peak to a preferred level when it is measured by the CMS. In another example, this step may include a determination of the CMS connections and control features needed to provide curtailment or load shedding to the site. In yet another example, the CMS may be designed around whether load shedding of certain electrical systems would cause new peaks to arise in the aggregate load profile. Other design considerations may go into the performance of this step that would be apparent to a person having ordinary skill in the art of designing CMSs.

In some embodiments step 114 may follow the completion of step 112, whereby a CMS is provided to the site. This step may include purchasing, building, or otherwise obtaining the parts of the CMS that are included in the design of step 112. It may also include sending the CMS to the site, installing it at the site, or accepting the CMS for the site. Alternatively, a CMS may be provided in step 114 when the designs of step 112 are transmitted to others, such as representatives of the site, which may be the consumer at the site or another involved party. In this case, the CMS designs may be used by the receiving party to build and implement the CMS according to the designs provided and to manage the consumption of the electrical systems of the site using the CMS that had been designed. The completion of step 114, or step 112, if step 114 is skipped, indicates the end of this method 100.

Aggregation of Consumption Management System Requirements

Figure 3:
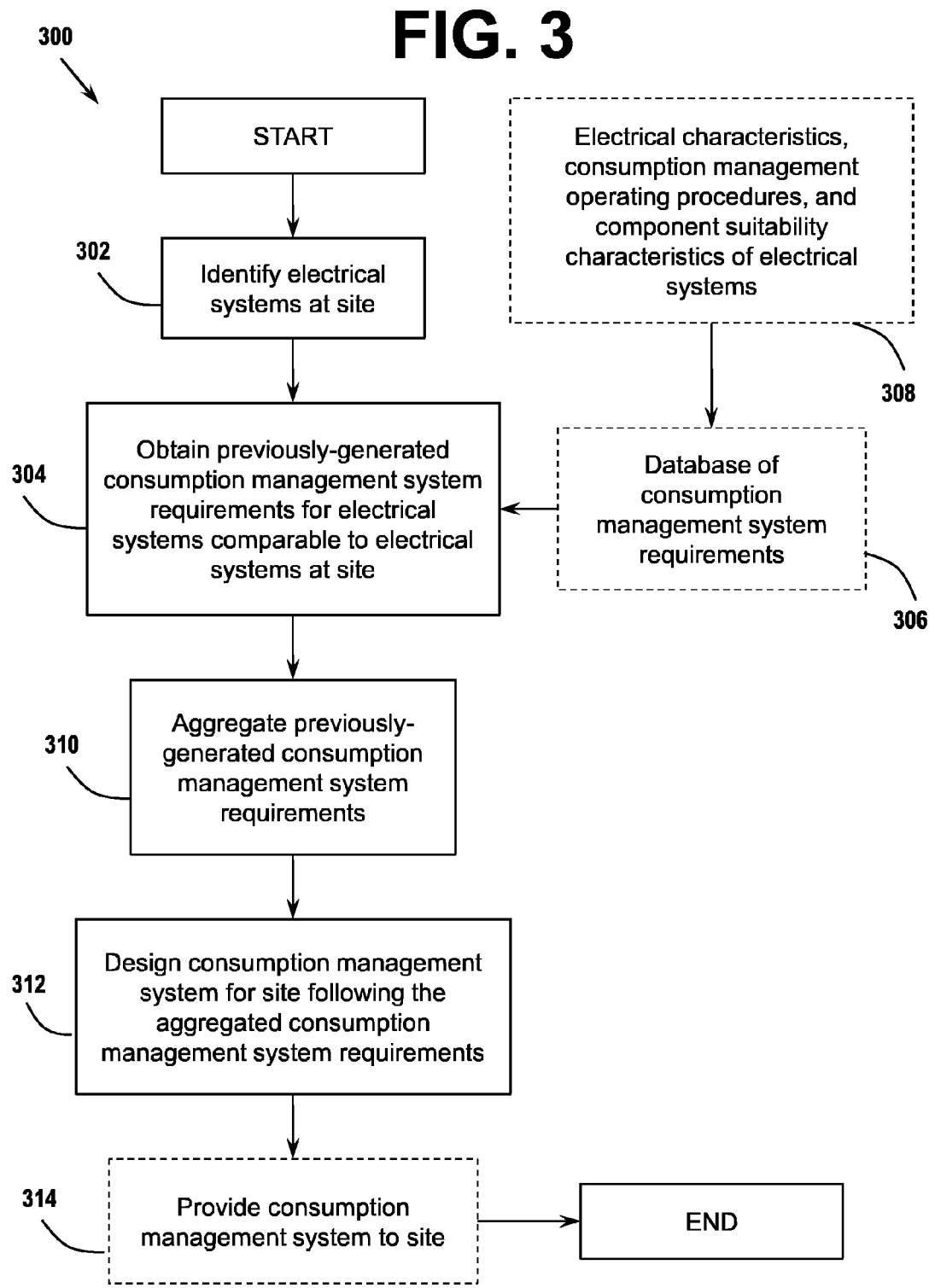
FIG. 3 is a block diagram flowchart illustrating a method of an embodiment of the invention.

FIG. 3 illustrates method 300, an embodiment of designing and providing a CMS to a site based on an identification or inventory of electrical systems at a site. The method 300 begins the same way as method 100, by identifying electrical systems at the site in step 302. Next, previously-generated CMS requirements for electrical systems that are comparable to the electrical systems identified are obtained. The performance of this step is mechanically the same as step 104, but in this case, the information obtained is previously-generated CMS requirements instead of load profiles. CMS requirements may include electrical characteristics, CMS operating procedures, and component suitability characteristics of the comparable electrical systems. These requirements may be stored in a database of consumption management system requirements, as shown in box 306, which database may or may not be the same as the database of load profiles discussed in connection with FIG. 1. The features of this database 306 may be the same as the database shown in box 106, with indexing, searchability, and other features previously mentioned, and the information indexed may include CMS requirements as indicated by box 308. Comparability of electrical systems in step 304 is determined by the actual or estimated similarity between the CMS requirements the two electrical systems, and not necessarily whether they would have similarity or comparability between their load profiles.

CMS operating procedures are instructions linked to an electrical system that are related to the operation of a CMS when it is controlling the electrical system. For example, CMS operating procedures may include information about when the electrical system may be safely curtailed, the ways that the electrical system may be controlled or adjusted to have its consumption controlled or adjusted, indications of dangerous operating conditions, or other information generated that informs the user or controller about how to operate the electrical system for consumption management. CMS operating procedures for an electrical system that is an energy storage system may include safe voltage (or some other condition) operating boundaries, directions for where or how to install the energy storage system, procedures for using connective means or converter means between the energy storage and other portions of a site, etc.

Component suitability characteristics of electrical systems describe the components of a CMS that are suitable to manage the consumption of the electrical system. Exemplary characteristics include information about devices that would be suitable to curtail the particular electrical system, information about energy sources that can mitigate the electrical system, compatible load shedding devices and parameters, and other such information. These characteristics may vary from site to site or from electrical system to electrical system, depending on where or when the characteristics are generated. Component suitability characteristics of electrical systems may overlap with electrical characteristics or operating procedures of an electrical system in some respects.

Once the previously-generated CMS requirements for electrical systems comparable to the electrical systems identified at the site are obtained in step 304, the previously-generated CMS requirements are aggregated in step 310. Electrical characteristics, consumption management operating procedures, and component suitability characteristics of the electrical systems are collected and compared to produce an aggregate requirement listing. For instance, if the CMS requirements obtained include times when curtailment may take place for various loads, these requirements are combined into a timeline of curtailment opportunities, the total amount of curtailment available from all electrical systems at any given time, times when curtailment is unavailable, or another combination of the information that would be useful in designing a CMS for the site. In another example, if the CMS requirements include electrical characteristics of the electrical systems, they may be aggregated to determine the total power output of converters needed to connect the electrical systems to an energy storage system, the number of connections needed to control all of the electrical systems at the site, or other relevant information that could be used in step 312.

Step 312 comes next, wherein a CMS is designed for the site which follows the aggregated CMS requirements, similar to how the CMS is designed in step 112 with components, electrical characteristics, etc. Step 314 may optionally follow step 312 before the end of the method, wherein a CMS is provided to the site as discussed in detail with step 114.

Use of Aggregate Unprofiled Electrical System Load Profiles for Load Profiling

In some sites, databases of electrical systems, CMS requirements, and load profiles are incomplete or out of date, so aggregating previously-generated load profiles may not provide an acceptable model of what an overall load profile would be, and there may be room for improvement by profiling new loads. In some situations, an overall load profile for the site may be available or determinable, but aggregating known CMS requirements and load profile information does not correct the effects of some undesirable resulting load profile characteristics or electrical charges at the site. In still other cases, it may be that some electrical systems at a site do not have usable load profiles for aggregation, and there is a need for a method of determining load profiles of loads and electrical systems that can be catalogued and indexed for use in designs and implementations of future CMSs or for other purposes. The following methods provide means for a user to determine which electrical systems would be beneficial to profile or for which to it would be beneficial to collect or generate CMS suitability characteristics, and then to put this information to use.

Figure 4:
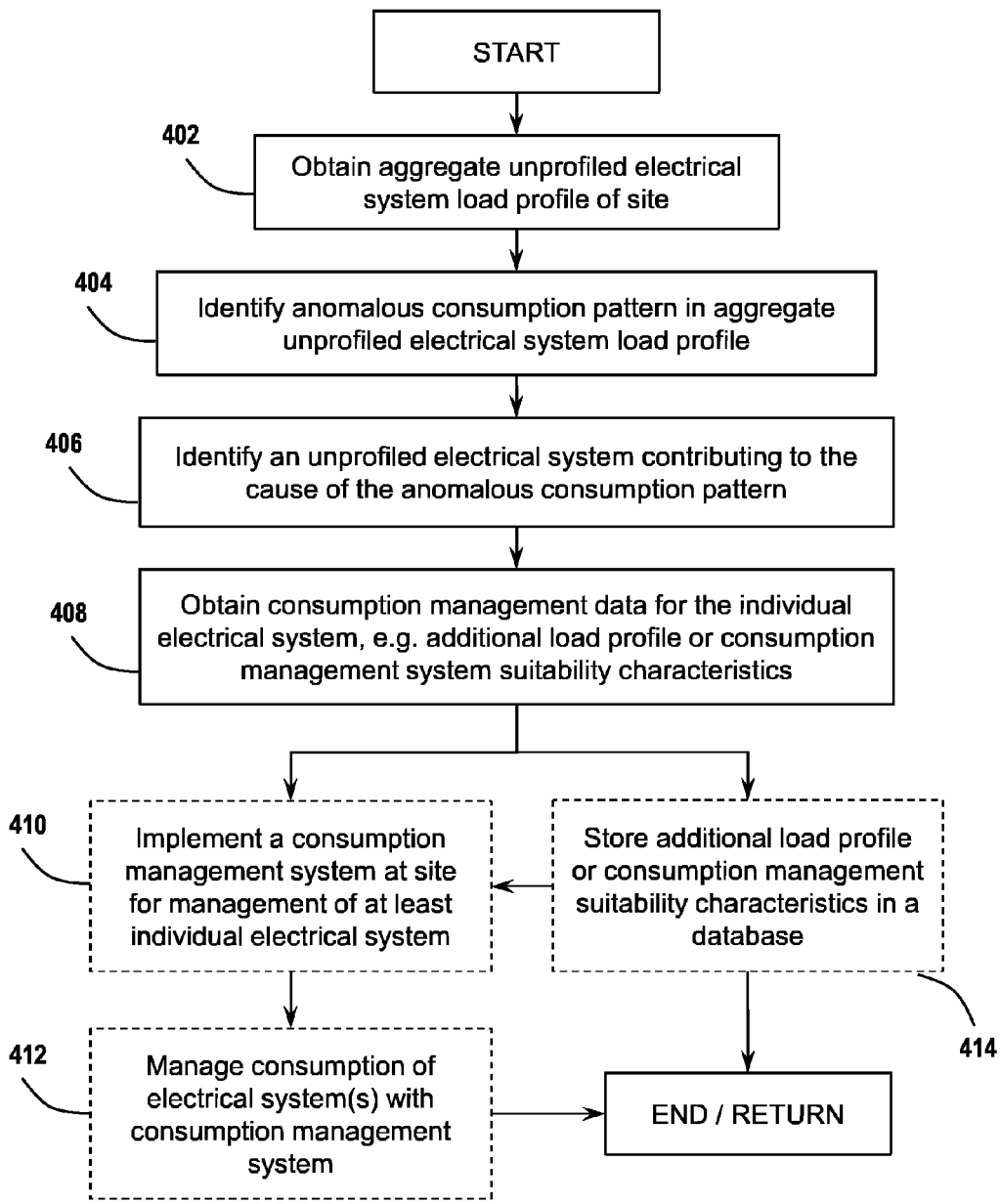
FIG. 4 is a block diagram flowchart illustrating a method of an embodiment of the invention.
Figure 7:
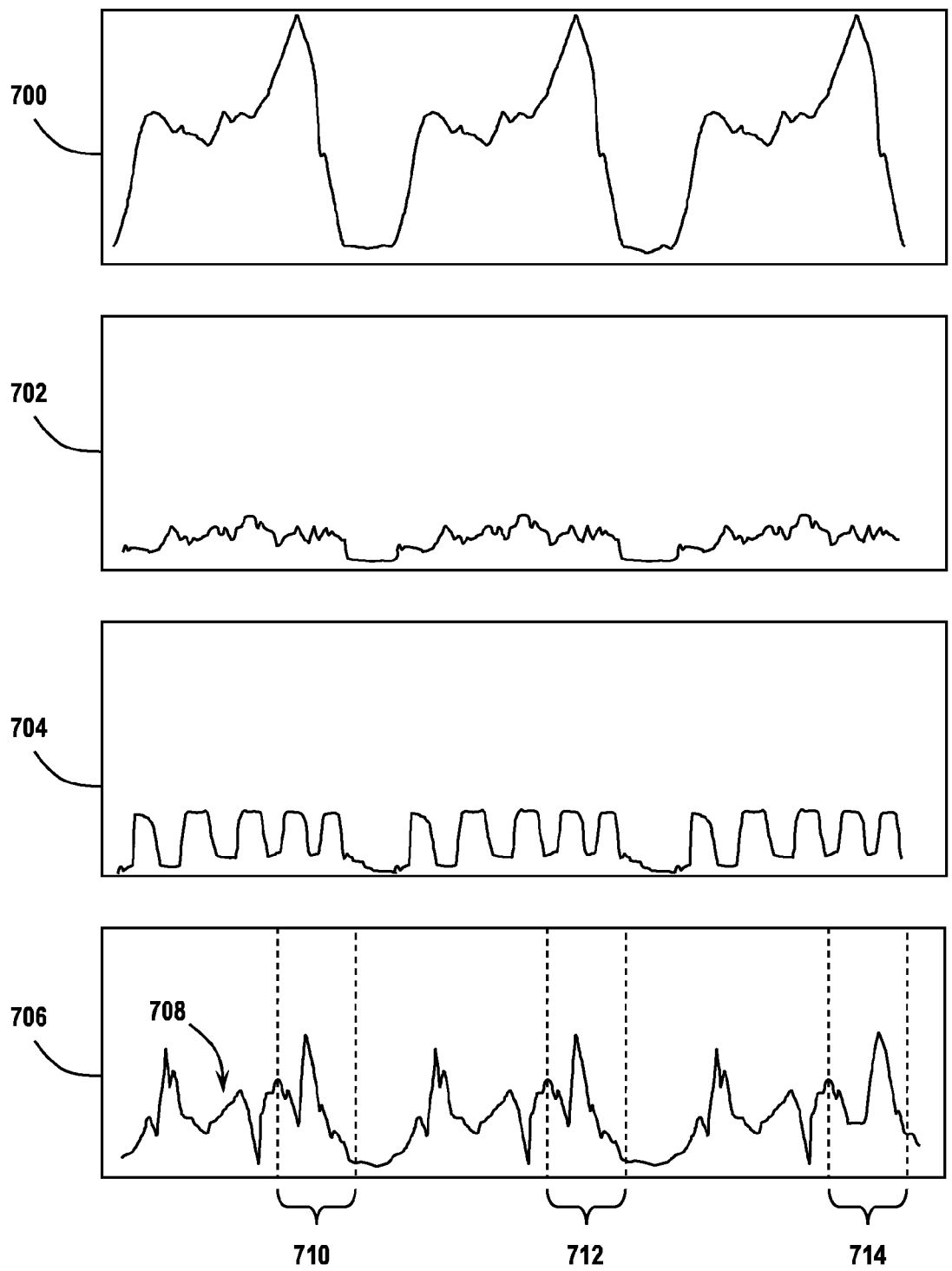
FIG. 7 shows charted load profiles of electrical systems, an overall load profile, and an aggregate unprofiled electrical system load profile of a site.

FIG. 4 shows a flowchart illustration of an embodiment of the invention of a method 400 related to guiding the obtaining and using of load profiles for unprofiled loads at a site. FIGS. 5, 6, 7, and 8 show charts of load profiles that will be used as a reference to illustrate features of the embodiment described in FIG. 4 and other figures below.

The method 400 starts when an aggregate unprofiled electrical system load profile of a site is obtained in step 402. One manner in which this step may be performed is by obtaining an overall load profile representing the consumption of all electrical systems, whether previously-profiled or not, at the site, then subtracting all time-corresponding load profiles of the profiled electrical systems at the site from the overall load profile. This produces an aggregate unprofiled electrical system load profile, which is a load profile that is an aggregation of all of the electrical systems at the site for which no acceptable load profile is available. FIG. 5 shows a chart 500 of an overall load profile of a site, wherein the consumption of all electrical systems at the site is combined. Charts 502, 504, and 506 illustrate some of the load profiles of electrical systems at the site (not to scale) that are previously generated. FIG. 6 shows a chart 600 wherein the overall load profile of chart 500 is shown as profile 602. All previously-generated loads are subtracted from profile 602 to produce profile 604, the aggregate unprofiled electrical system load profile. Likewise, in FIG. 7, chart 700 shows the overall load profile of a site, this time over a period of approximately three days, charts 702 and 704 show previously-generated load profiles for some loads at the site (not to scale), and chart 706 shows an aggregate unprofiled electrical system load profile 708 that is obtained when all previously-generated load profiles are subtracted from the overall load profile of chart 700.

In some embodiments the aggregate unprofiled electrical system load profile represents the total consumption at the site wherein the cause of the consumption is not recorded as being linked to a specific electrical system at the site. An overall load profile may be used in step 402 that is generated as part of the completion of this step, or it may be an overall load profile that has been previously generated.

In another embodiment, step 402 may be completed by connecting one or more consumption measurement system to the loads at the site for which no acceptable load profile is available, and aggregating the output of the consumption measurement systems into an aggregate unprofiled electrical system load profile of the site. This embodiment is not as preferable as the preceding embodiments since it requires more equipment and it can be difficult to find and monitor all of the loads that would be needed to create the aggregate unprofiled electrical system load profile. Other methods of obtaining the aggregate unprofiled electrical system load profile may also be used, as will be apparent to those knowledgeable in the art of consumption measurement and management.

In the next step 404, an anomalous consumption pattern is identified, detected, or determined in the aggregate unprofiled electrical system load profile. An anomalous consumption pattern is a one-time occurring or recurring pattern in a load profile that is different than would otherwise be considered normal, or that meets a predetermined set of guidelines or criteria for identifying an anomaly in a load profile. For example, an anomalous consumption pattern may be a peak or drop in consumption that appears once ever, or once per week. In chart 606, the patterns of the aggregate unprofiled system load profile include consumption peak 608, consumption drop 610, and consumption peak 612. These peaks or drops may be predetermined under guidelines or criteria such as: (1) "a peak that is 10 kW higher than the surrounding load profile for 3 minutes or longer," (2) "a drop-off in consumption of more than 15 kW from the average consumption level between the hours of 6:00 a.m. and 6:00 p.m.," (3) "a peak that contributes 25% or more of the total load that appears in a peak in the overall load profile that is 45 kW or higher for 2 minutes or more" (as peak 612 could represent), or another comparable set of guidelines. The peaks or drops may also be a recurring pattern, where a peak appears at the same time every day, or a plateau of consumption occurs on weekdays in the summer, but not in the winter, or another pattern that would suggest that something is abnormal at that time in the load profile or at the site. In chart 706, the aggregate unprofiled electrical system load profile 708 has a particular recurring load pattern in periods 710 and 712, but the pattern is delayed on the third day in period 714, so the consumption of period 714 may be considered to be an identified anomalous consumption pattern. Thus, in some embodiments, an anomalous consumption pattern is a consumption pattern that may appear to be normal in its magnitude, but appears at an abnormal time.

The identification of an anomalous consumption pattern may take place by running the load profile through a computer program algorithm for detecting anomalies in a load profile, by personal observation, by reference through another system of measurement, such as by tracking anomalous temperature changes and then referring to the load profile to confirm the presence of an anomalous consumption pattern, or some other means apparent to one of skill in the art.

With an anomalous consumption pattern identified in step 404, the next step 406 is to identify an unprofiled electrical system contributing to the cause of the anomalous consumption pattern. Because the aggregate unprofiled electrical system load profile is only comprised of the consumption of unprofiled loads, one or more of the electrical systems at the site that are unprofiled is causing or contributing to the cause of the anomalous consumption pattern, and in this step 406, they are found. For example, a user may notice an anomalous consumption pattern in the form of a peak that appears at the same time each morning. Under step 406, the magnitude of the peak is examined and electrical systems at the site that are likely contributors to the cause of the peak are singled out, such as a coffee maker that typically operates only in the mornings or a refrigerator that is stocked in the mornings, causing the compressor to turn on in the mornings more than at other times. These systems may then be adjusted or controlled at that time in the morning to determine, for example, whether turning them off eliminates or otherwise affects the anomalous consumption pattern. If an electrical system affects the anomalous pattern, it has been identified as an unprofiled electrical system contributing to its cause.

Once an individual electrical system has been identified as directly contributing to the cause of the anomalous consumption pattern, the next step 408 is to obtain consumption management data such as an additional load profile and/or consumption management suitability characteristics for it. The additional load profile may be obtained through measurement of its consumption over time and generating a load profile for the electrical system, it may be obtained by matching the electrical system that is identified with a load profile that is from a comparable electrical system, or it may be obtained through another means apparent to those having skill in the art. Consumption management suitability characteristics may also be assembled for the electrical system by inspection of the system or its load profile. After the completion of step 408, the method 400 may end or may return to the start. Upon returning to the start, the next iteration of the method 400 would obtain an aggregate unprofiled electrical system load profile that now does not contain the load profile of the individual electrical system, and the anomalous consumption pattern will be decreased, diminished, or eliminated from the next-obtained aggregate unprofiled electrical system load profile. In this fashion, repeated performance of the method 400 may be completed until no anomalous consumption patterns exist in the unprofiled electrical system load profile of the site.

Figure 8:
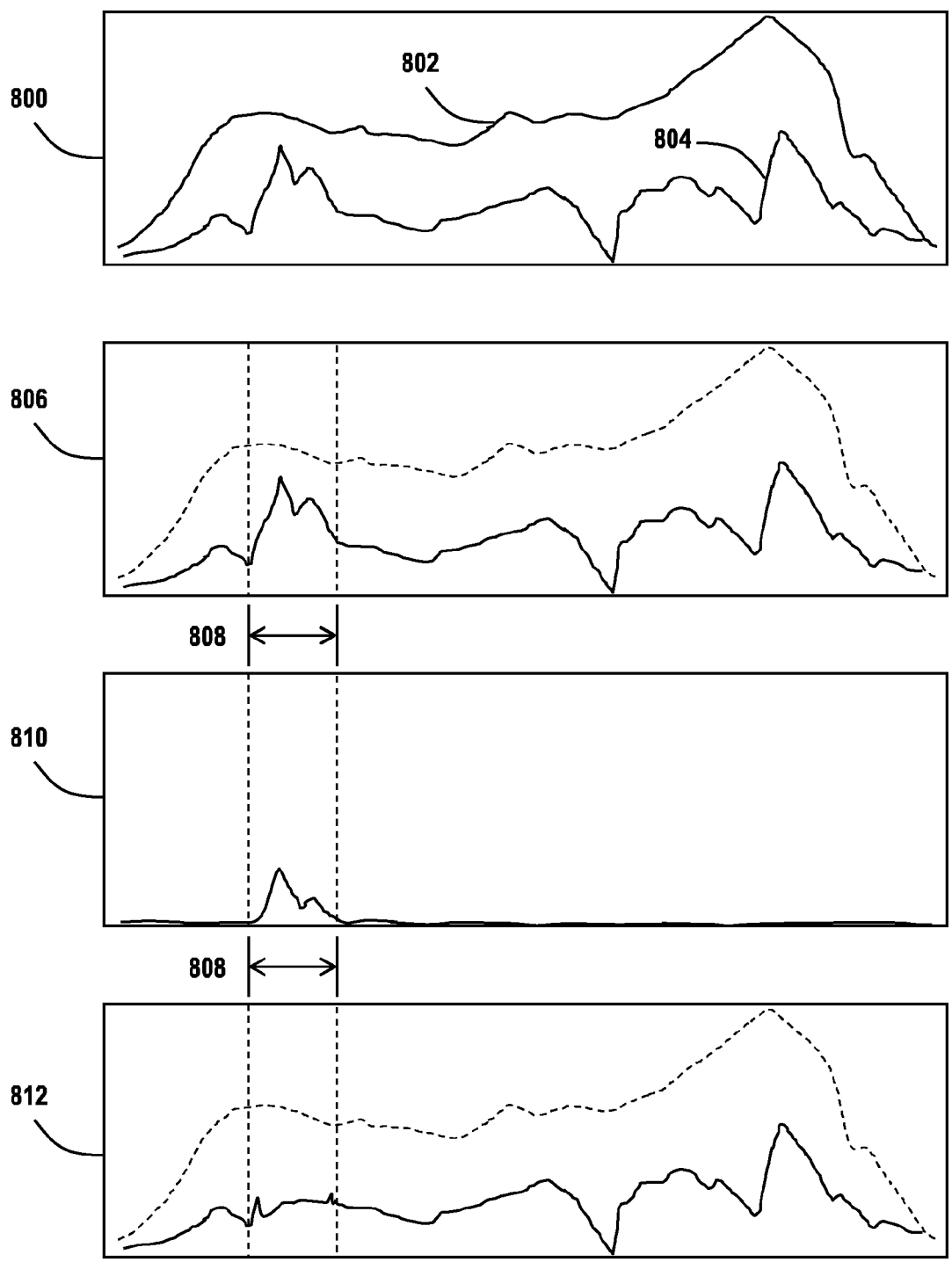
FIG. 8 illustrates a method of using an aggregate unprofiled load profile to obtain an additional load profile of an individual electrical system at a site and a result when the method is repeated.

For example, FIG. 8 shows several charts having load profiles of electrical systems and aggregations of electrical systems at a site. In chart 800, an overall load profile 802 and an aggregate unprofiled electrical system load profile 804 of the overall load profile 802 are shown together. Chart 806 shows an anomalous consumption pattern detected within period 808. The electrical system or systems contributing to the cause of this pattern are identified, and an additional load profile is obtained for the electrical system, as shown in chart 810. It is clear when looking at chart 810 that the electrical system identified contributes to the cause of the anomalous consumption pattern in period 808 since the load profile of chart 810 has a peak during that period 808. If the method is repeated, then the next aggregate unprofiled electrical system load profile (shown in chart 812), has a diminished anomalous consumption pattern during period 808 because in this next iteration of the method, the load profile in chart 810 is now part of the set of profiled electrical systems at the site. Therefore, in this next iteration of the method, an anomalous consumption pattern is not identified in period 808, and the electrical system that has the profile of chart 810 can be better managed by a CMS implemented at the site.

A "diminished" consumption pattern may have a decreased magnitude of consumption, a more corrected time of appearance, a decreased effect on the overall consumption or an aggregated load profile, a decreased rate of appearance, a reduced effect on utility costs, or a related result that may be apparent to one skilled in the art.

In some embodiments, after performance of step 408, step 410 is completed before the process ends or returns to the start. If this is the case, in step 410, a CMS is implemented at the site for management of at least the individual electrical system identified in step 406 and for which a profile is obtained in step 408. Implementing a CMS may be equivalent to providing a CMS as discussed previously in this document, such as installing a CMS or providing a design of a CMS to a site or to the representative of a site. The CMS implemented in this step 410 is capable of managing the consumption of the electrical system identified. Therefore, if a CMS is already in place at the site at the start of the method 400, in this step the implementation of the CMS may be defined as merely adding capability of the CMS to manage the consumption of the individual electrical system, if not installing or implementing a completely different or new CMS.

Step 412 shows a step present in some embodiments wherein the consumption of the electrical system or systems managed by the CMS of step 410 is actually managed by the CMS. In other words, this step may include discharging an energy storage system to prevent a peak in the consumption of the electrical system or systems, curtailing loads when consumption begins to rise, and executing other methods of managing consumption.

In some embodiments, the additional load profile or consumption management suitability characteristics for the electrical system that are obtained in step 408 are added to or stored in a database. This database may be the same as or separate from the databases discussed previously in this document, and may have the features and characteristics of the databases previously discussed in this document. This step may be performed in parallel with steps 410 or 412 before the end of the process 400, may be performed without performance of steps 410 or 412, or in sequence therewith, as indicated by the arrows in FIG. 4.

FIG. 9 shows another embodiment of the invention that is a method 900 of adjusting the usage of individual electrical systems at a site which is related to the method of FIG. 4. In this method 900, an aggregate unprofiled electrical system load profile of the site is obtained in step 902, and then an anomalous consumption pattern is identified in the aggregate unprofiled electrical system load profile in step 904. Next, electrical systems contributing to the cause of the anomalous consumption pattern are investigated and identified in step 906, as is described in step 406. However, in this embodiment, instead of obtaining an additional load profile or CMS suitability characteristics, the usage of the individual electrical system is adjusted by means other than use of a CMS. For example, if the individual electrical system identified is a refrigerator that has a compressor that turns on at an inopportune time of day that causes a spike in consumption at that time because the refrigerator has its doors left open for a long period of time while it is restocked, then in step 908, the time at which the stocking of the refrigerator takes place may be adjusted to a more opportune time, the temperature of the refrigerator settings may be turned up manually, or the doors may have automatic closing hinges installed to prevent the peak from appearing, or some other non-CMS adjustment may take place that would diminish or eliminate the appearance of the anomalous consumption pattern. In some embodiments, this adjustment is accompanied by or preceded by the obtaining and storage of a load profile for the individual electrical system in a database, as shown by step 910.

Aggregate Load Profiles for Consumption Management System Implementation

FIG. 10 is another process flowchart showing a method 1000 of using an aggregate unprofiled electrical system load profile to directly obtain consumption management suitability characteristics, and potentially to store these characteristics or use them in implementing a CMS at a site. At the start, an aggregate unprofiled electrical system load profile of the site is obtained in step 1002. Next, an anomalous consumption pattern in the aggregate unprofiled electrical system load profile is identified in step 1004. With this pattern identified, consumption management suitability characteristics of the pattern are obtained in step 1006 and the process 1000 may end.

For an anomalous consumption pattern, consumption management system criteria or suitability characteristics may be obtained by examining the load profile characteristics of the pattern and determining CMS characteristics or components that would be needed to diminish the anomalous consumption pattern. This step 1006 differs from comparable steps in previous methods described herein in that the CMS characteristics or components are not directly reliant on identification of a particular individual electrical system, but are determined from the aggregation of multiple unprofiled electrical systems' load profiles (presumably, if there is more than one unprofiled electrical system at the site). Therefore, the CMS characteristics or components obtained from this pattern are characteristics or components that would apply to all of the unprofiled loads, and possibly also all of the profiled loads, such as an energy storage device that is connected to the main panel of the site and is capable of supplying energy to the entire site without respect to particular loads or electrical systems. The information obtained in this step 1006 may also be the required energy storage capacity of the energy storage device, or the maximum current rating needed in connections between such a device and the main electrical network in the site.

Likewise, CMS characteristics or components identified in the consumption management suitability characteristics of this step 1006 may include general curtailment or demand response capability of a controller. These characteristics may include an indication that the controller of the CMS needs to be able to reduce the load of the unprofiled electrical systems by a certain value, or to be able to do so at a particular time of day or year in connection with a demand response program that the site may participate in.

In some embodiments, after completion of step 1006, a CMS may be implemented at the site under step 1008 that has the consumption management suitability characteristics identified in step 1006, and in yet further embodiments, the CMS may be used to manage the consumption of electrical systems at the site, or the site as a whole, to diminish the anomalous consumption pattern in step 1010 before the process 1000 ends. In some other embodiments, the consumption management suitability characteristics and the anomalous consumption pattern or the aggregate unprofiled electrical system load profile is stored in a database, as typified by step 1012. Step 1012 may act as the final step in the process 1000, or it may be performed in parallel or in sequence with steps 1008 and/or step 1010, as indicated by the arrows connected thereto.

Miscellaneous Definitions and Embodiment Scope Information

Generally speaking, as used herein a "power converter" may refer to a generic electric power converter, inverter, transformer, regulator, voltage stabilizer, rectifier, power supply unit, or other conversion device or combination of these devices that may be used to convert the voltage, frequency, and/or phase of an electrical power source or signal from one form into another form.

As used herein, an "energy storage device" ("ESD") or "energy storage system" ("ESS") is a means for storing energy such as, for example, electrochemical batteries, compressed gas storage, pumped hydro storage, flywheel energy storage, capacitive energy storage, superconductive magnetic energy storage, fuel cell energy storage, combinations thereof, and other similar devices for energy storage known in the art. If the energy storage device includes a battery, the battery types may include rechargeable or non-rechargeable chemistries and compositions, such as, for example, lead-acid, alkaline, secondary lead acid, lithium-ion, sodium (zebra), nickel-metal hydride, nickel cadmium, combinations thereof, and other energy storage chemistries known in the art. Energy storage devices may be comprised of small or large numbers of cells, capacities, voltages, amperages, and other battery properties. They may be configured in unitary or modular designs and may follow standardized guidelines or customized specifications.

Some methods and systems of the embodiments of the invention disclosed herein may also be embodied as a computer-readable medium containing instructions to complete those methods or implement those systems. The term "computer-readable medium" as used herein includes not only a single physical medium or single type of medium, but also a combination of one or more tangible physical media and/or types of media. Examples of a computer-readable medium include, but are not limited to, one or more memory chips, hard drives, optical discs (such as CDs or DVDs), magnetic discs, and magnetic tape drives. A computer-readable medium may be considered part of a larger device or it may be itself removable from the device. For example, a commonly-used computer-readable medium is a universal serial bus (USB) memory stick that interfaces with a USB port of a device. A computer-readable medium may store computer-readable instructions (e.g. software) and/or computer-readable data (i.e., information that may or may not be executable). In the present example, a computer-readable medium (such as memory) may be included to store instructions for the controller to operate the heating of the ESD and historical or forecasted temperature data for the ESD or its surroundings.

In some embodiments the energy storage devices may be integrated with or connected to power management systems, such as those used for peak mitigation, load leveling, or backup or uninterruptible power supplies, since they may conveniently provide the electronic equipment needed to connect an energy storage device to the distribution grid. However, energy storage devices that serve other purposes may be utilized when the necessary connecting equipment is used. Such connecting equipment may comprise power converters for changing voltage signals, inverters for changing AC signals to DC signals (or vice versa), controllers for directing the operation of the power converters, signal conditioning electronics such as stabilizing capacitors, cables, connectors, and other items required to efficiently and safely bring the stored energy to the distribution grid.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

In addition, it should be understood that the figures described above, which highlight the functionality and advantages of the present invention, are presented for example purposes only and not for limitation. The exemplary architecture of the present invention is sufficiently flexible and configurable, such that it may be utilized in ways other than that shown in the figures. It will be apparent to one of skill in the art how alternative functional, logical or physical partitioning, and configurations can be implemented to implement the desired features of the present invention. Also, a multitude of different constituent module or step names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in multiple various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the time described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or component of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of exemplary block diagrams and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Further, the purpose of the Abstract is to enable the U.S. Patent and Trademark Office and the public generally, and especially the scientists, engineers, and practitioners in the art who are not familiar with patent or legal terms or phraseology to determine quickly from a cursory inspection the nature and essence of the technical disclosure of the application. The Abstract is not intended to be limiting as to the scope of the present invention in any way.

What is claimed is:

1. A method of using a controller to execute stored instructions to obtain load profiles for unprofiled loads at a site, comprising:
    obtaining a single aggregate unprofiled electrical system load profile covering a plurality of unprofiled electrical systems at a site by measuring electrical characteristics of the plurality of unprofiled electrical systems with a consumption measurement system;
    identifying an anomalous consumption pattern in the aggregate unprofiled electrical system load profile, the anomalous consumption pattern comprising consumption values that represent a one-time occurring pattern or a recurring pattern in the aggregate unprofiled electrical system load profile that meet a predetermined set of guidelines or criteria to identify an anomaly in the aggregate unprofiled electrical system load profile;
    identifying an individual electrical system at the site contributing to a cause of the anomalous consumption pattern in the aggregate unprofiled electrical system load profile, the individual electrical system being identified due to correlation between consumption of the individual electrical system and the consumption values of the anomalous consumption pattern; and
    obtaining consumption management data for the individual electrical system using the consumption measurement system.

2. The method of claim 1, wherein the aggregate unprofiled electrical system load profile is obtained by subtracting at least one stored load profile of a profiled electrical system at the site from an overall load profile of the site.

3. The method of claim 1, further comprising:
    storing the consumption management data in a database.

4. The method of claim 1, further comprising:
    implementing a consumption management system to the site capable of managing consumption of said individual electrical system.

5. The method of claim 4, further comprising:
    managing the consumption of said individual electrical system using said consumption management system.

6. The method of claim 1, wherein said consumption management data comprises an additional load profile for the individual electrical system.

7. The method of claim 1, wherein said consumption management data comprises consumption management system suitability characteristics for the individual electrical system.

8. The method of claim 1, wherein said consumption values comprise load magnitude values, and wherein said individual electrical system at the site is identified due to correlation between load magnitude values of the individual electrical system and the load magnitude values of the anomalous consumption pattern.

9. The method of claim 1, wherein said consumption values comprise time of consumption values, and wherein said unprofiled individual electrical system at the site is identified due to correlation between time that consumption takes place of the unprofiled individual electrical system and the time of consumption values of the anomalous consumption pattern.

10. A method of using a controller to execute stored instructions to manage consumption of electrical systems at a site, comprising:
    obtaining a single aggregate unprofiled electrical system load profile covering a plurality of unprofiled electrical systems at a site by measuring electrical characteristics of the plurality of unprofiled electrical devices with a consumption measurement system;
    identifying an anomalous consumption pattern in the aggregate unprofiled electrical system load profile, the anomalous consumption pattern comprising consumption values that represent a one-time occurring pattern or a recurring pattern in the aggregate unprofiled electrical system load profile that meet a predetermined set of guidelines or criteria to identify an anomaly in the aggregate unprofiled electrical system load profile; and
    obtaining consumption management system criteria from the anomalous consumption pattern in the aggregate unprofiled electrical system load profile.

11. The method of claim 10, wherein the aggregate unprofiled electrical system load profile is obtained by subtracting at least one stored load profile of a profiled electrical system at the site from an overall load profile of the site.

12. The method of claim 10, wherein the consumption management criteria define requirements for a consumption management system to diminish the anomalous consumption pattern in the aggregate unprofiled electrical system load profile.

13. The method of claim 10, further comprising:
    storing said consumption management criteria in a database of consumption management criteria.

14. The method of claim 10, further comprising:
    implementing a consumption management system at the site capable of managing consumption of one or more electrical systems at the site, the consumption management system meeting said consumption management system criteria.

15. The method of claim 14, further comprising:
    managing the consumption of electrical systems at the site using said consumption management system.

16. The method of claim 15, further comprising:
    managing the consumption of electrical systems at the site using said consumption management system in such a manner as to diminish the anomalous consumption pattern.

17. The method of claim 14, wherein the implemented consumption management system is configured to diminish the anomalous consumption pattern through curtailment or load shedding of unprofiled electrical systems at the site.

18. The method of claim 14, wherein the implemented consumption management system is configured to diminish the anomalous consumption pattern through providing energy to the unprofiled electrical systems at the site from energy storage or energy generation in the consumption management system.

19. The method of claim 10, said anomalous consumption pattern having load profile characteristics, wherein said consumption management system criteria correlate with the load profile characteristics of the anomalous consumption pattern.

20. A method of using a controller to execute stored instructions to obtain load profiles for unprofiled loads at a site, comprising:
    obtaining a single aggregate unprofiled electrical system load profile covering a plurality of unprofiled electrical devices at a site by measuring electrical characteristics of the plurality of unprofiled electrical devices with a consumption measurement system;
    identifying an anomalous consumption pattern in the aggregate unprofiled electrical system load profile, the anomalous consumption pattern comprising consumption values that represent a one-time occurring pattern or a recurring pattern in the aggregate unprofiled electrical system load profile that meet a predetermined set of guidelines or criteria to identify an anomaly in the aggregate unprofiled electrical system load profile;
    identifying an individual electrical system at the site contributing to a cause of the anomalous consumption pattern in the aggregate unprofiled electrical system load profile, the individual electrical system being identified due to correlation between consumption of the individual electrical system and the consumption values of the anomalous consumption pattern; and
    adjusting usage of the individual electrical system to diminish the anomalous consumption pattern.

* * * * *